United States Patent
Suh et al.

(10) Patent No.: US 7,505,832 B2
(45) Date of Patent: Mar. 17, 2009

(54) METHOD AND APPARATUS FOR DETERMINING A SUBSTRATE EXCHANGE POSITION IN A PROCESSING SYSTEM

(75) Inventors: Dongchoon Suh, Santa Clara, CA (US); Akihiro Hosokawa, Cupertino, CA (US); Hung The Nguyen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 772 days.

(21) Appl. No.: 10/802,363

(22) Filed: Mar. 16, 2004

(65) Prior Publication Data

US 2004/0230341 A1    Nov. 18, 2004

Related U.S. Application Data

(60) Provisional application No. 60/469,968, filed on May 12, 2003.

(51) Int. Cl.
*G05B 15/00* (2006.01)
*G05B 19/00* (2006.01)

(52) U.S. Cl. .................................. 700/264; 700/245

(58) Field of Classification Search ................ 700/244, 700/254, 262, 256, 259, 248
See application file for complete search history.

(56) References Cited

U.S. PATENT DOCUMENTS

| 5,535,306 | A | * | 7/1996 | Stevens | 700/254 |
|---|---|---|---|---|---|
| 5,537,311 | A | | 7/1996 | Stevens | |
| 5,762,745 | A | * | 6/1998 | Hirose | 156/345.31 |
| 6,205,870 | B1 | * | 3/2001 | Hosokawa et al. | 73/865.9 |
| 6,217,212 | B1 | * | 4/2001 | Brenninger et al. | 374/45 |
| 6,257,045 | B1 | * | 7/2001 | Hosokawa et al. | 73/1.79 |
| 6,313,596 | B1 | | 11/2001 | Wyka et al. | |
| 6,314,631 | B1 | * | 11/2001 | Pryor | 29/407.04 |
| 6,327,517 | B1 | * | 12/2001 | Sundar | 700/245 |
| 6,430,468 | B1 | * | 8/2002 | Tepman et al. | 700/218 |
| 6,510,365 | B1 | * | 1/2003 | Nishinakayama et al. | 700/214 |
| 6,516,244 | B1 | * | 2/2003 | Yoo et al. | 700/218 |
| 6,549,825 | B2 | * | 4/2003 | Kurata | 700/245 |
| 6,556,887 | B2 | * | 4/2003 | Freeman et al. | 700/218 |
| 6,577,923 | B1 | * | 6/2003 | White et al. | 700/245 |
| 6,689,519 | B2 | * | 2/2004 | Brown et al. | 430/30 |

(Continued)

FOREIGN PATENT DOCUMENTS

EP    0 820 091    1/1998

OTHER PUBLICATIONS

PCT International Search Report and Written Opinion for PCT/US2004/014710, dated Sep. 20, 2004 (AMAT/8170.PC).

*Primary Examiner*—Khoi Tran
*Assistant Examiner*—Nicholas Kiswanto
(74) *Attorney, Agent, or Firm*—Patterson & Sheridan LLP (57) ABSTRACT

Embodiments of a method and apparatus for determining a substrate exchange position in a processing system are provided. In one embodiment, a method of determining a substrate exchange position in a processing system includes determining an initial exchange position within a processing chamber, and resolving a change in the exchange position. The step of resolving may further include the step of sensing a change in temperature of a facet of a transfer chamber having the processing chamber coupled thereto, sensing a change in a state of the system, or sensing a change in position of the processing chamber, among others.

18 Claims, 8 Drawing Sheets

U.S. PATENT DOCUMENTS

| | | | |
|---|---|---|---|
| 6,746,237 B2 * | 6/2004 | Storm et al. | 432/5 |
| 6,944,517 B2 * | 9/2005 | Krupyshev | 700/114 |
| 7,039,501 B2 * | 5/2006 | Freeman et al. | 700/258 |
| 2003/0014155 A1 | 1/2003 | Pencis et al. | |
| 2003/0185664 A1 * | 10/2003 | Mitsui et al. | 414/935 |
| 2007/0112465 A1 * | 5/2007 | Sadighi et al. | 700/254 |

* cited by examiner

METHOD AND APPARATUS FOR DETERMINING A SUBSTRATE EXCHANGE POSITION IN A PROCESSING SYSTEM

CROSS-REFERENCE TO RELATED APPLICATION

This application claims benefit of U.S. Provisional Application No. 60/469,968, filed May 12, 2003, which is hereby incorporated by reference in its entirety.

BACKGROUND OF THE INVENTION

1. Field of the Invention

The embodiments of the invention generally relate to a method and apparatus for determining relative chamber positions in a semiconductor processing system.

2. Background of the Related Art

Semiconductor substrate processing is typically performed by subjecting a substrate to a plurality of sequential processes to create devices, conductors and insulators on the substrate. Each of these processes is generally performed in a process chamber configured to perform a single step of the production process. In order to efficiently complete the entire sequence of processing steps, a number of process chambers are typically coupled to a central transfer chamber that houses a robot to facilitate transfer of the substrate between the process chambers. A semiconductor processing platform having this configuration is generally known as a cluster tool, examples of which are the families of AKT PECVD, PRODUCER®, CENTURA® and ENDURA® processing platforms available from Applied Materials, Inc., of Santa Clara, Calif.

Generally, a cluster tool comprises a central transfer chamber having a robot disposed therein. The transfer chamber is generally surrounded by one or more process chambers. The process chambers are generally utilized to process the substrate, for example, performing various processing steps such as etching, physical vapor deposition, ion implantation, lithography and the like. The transfer chamber is sometimes coupled to a factory interface that houses a plurality of removable substrate storage cassettes, each of which houses a plurality of substrates. To facilitate transfer of a substrate between a vacuum environment of the transfer chamber and a generally ambient environment of the factory interface, a load lock chamber is disposed between the transfer chamber and the factory interface.

In flat panel processing, glass substrates such as those utilized to fabricate computer monitors, large screen televisions and displays for PDAs and cell phones and the like, are becoming dramatically larger as the demand for flat panels increases. For example, glass substrates utilized for flat panel fabrication have increased in area from 550 mm×650 mm to 1500 mm×1800 mm in just a few years, and are envisioned to exceed four square meters in the near future.

To accommodate processing such large area substrates, processing systems have also increased in size. For example, the internal diameter of a transfer chamber utilized to move such large substrates between processing chambers in a typical cluster tool has increased from about 80 to about 135 inches to accommodate the substrate size. The additional size and mass of the larger transfer chambers make these chambers more susceptible to deformation due to thermal effects. Chamber deformation may result in changes in position of the surrounding processing chambers relative to the center of the transfer chamber from which robotic motions during substrate transfer are referenced.

As the position of the processing chamber moves, the accuracy and repeatability of substrate placement during transfers between the transfer chamber and the processing chamber diminishes. In some cases, the accuracy and repeatability of substrate placement may exceed the substrate placement tolerances required to ensure good processing results and prevent substrate damage during transfer (e.g. due to misplacement of the substrate on either a substrate support within the processing chamber or on the robot's end effector when retrieving a substrate from the processing chamber). With the increased number of devices formed on large area substrates due to both increased device density and larger substrate areas, the value of each substrate has greatly increased. Accordingly, damage to the substrate or yield loss due to non-conformity because of substrate misalignment is highly undesirable.

The change in relative position between the processing and transfer chambers may be further aggravated as different processing chambers surrounding the transfer chamber change in temperature. For example, a processing chamber configured to perform a plasma enhanced chemical vapor deposition (PECVD) process may operate at a temperature of about 400 degrees Celsius, which may heat an adjoining facet of the transfer chamber to about 75 degrees Celsius. If the temperature of the PECVD processing chamber is decreased for service or other reasons, the reduced thermal load will cause the transfer chamber to contract, which may change the position and orientation of the facet relative the transfer chamber's centerline. Other facets positioned around the transfer chamber may be similarly affected.

In a steady state thermal condition, the relative positions between the processing chambers and transfer chambers are known, thereby allowing robot movement to be calibrated. However, changes in the thermal attributes of any of the chambers may cause the substrate exchange position in any chamber to move from its calibrated position, thereby greatly increasing the probability of substrate misalignment during transfers. An inaccurately positioned substrate is susceptible to damage during transfer and prevents repetitive device fabrication with low defect rates. Consequently, it would be beneficial to know or predict any change in relative position between chambers to ensure proper substrate placement.

Therefore, there is a need for an improved method and apparatus for determining a substrate exchange position to enable accurate and repeatable substrate transfers in cluster tools.

SUMMARY OF THE INVENTION

Embodiments of a method and apparatus for determining a substrate exchange position in a processing system are provided. In one embodiment, a method of determining a substrate exchange position in a processing system includes determining an initial exchange position within a processing chamber, and resolving a change in the exchange position. The step of resolving may further include the step of sensing a change in temperature at a facet of a transfer chamber having the processing chamber coupled thereto, sensing a change in a state of the system, or sensing a change in position of the processing chamber, among others.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
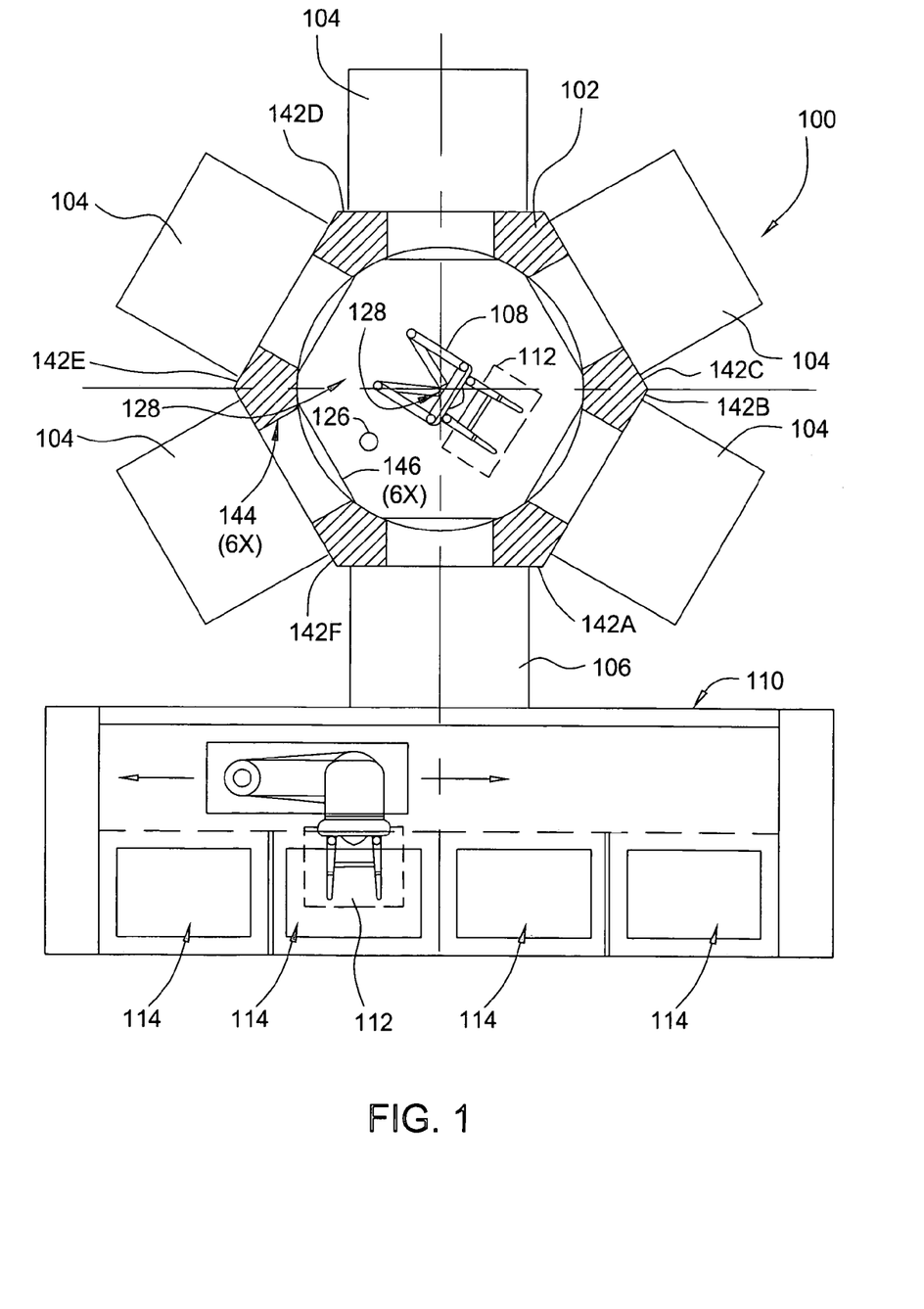
FIG. 1 is a plan view of one embodiment of a semiconductor processing system configured to determine a substrate transfer position.

FIG. 1 depicts one embodiment of a semiconductor processing system 100 configured for determining substrate exchange positions to enhance substrate placement accuracy and repeatability, particularly during conditions where processing system 100 experiences a change in thermal load. The exemplary processing system 100 generally includes a transfer chamber 102 circumscribed by one or more processing chambers 104, a factory interface 110 and one or more load lock chambers 106. In the embodiment depicted in FIG. 1, one load lock chamber 106 is disposed between the transfer chamber 102 and the factory interface 110 to facilitate substrate transfer between a vacuum environment maintained in the transfer chamber 102 and a substantially ambient environment maintained in the factory interface 110. A transfer robot 108 is centrally disposed in the transfer chamber 102 to move substrates between the chambers 104, 106. One example of a processing system which may be adapted to benefit from the invention is a 25K PECVD processing system available from AKT, Inc., a division of Applied Materials, Inc., located in Santa Clara, Calif. Although a method and apparatus for determining a substrate exchange position is described herein with reference to the exemplary processing system 100, it is contemplated that the invention may be adapted and practiced in other processing systems having different configurations, and is particularly suitable in applications where the chambers comprising the system are subject to temperature variations that may result in a change of their relative positions.

The factory interface 110 generally houses one or more substrate storage cassettes 114. Each cassette 114 is configured to store a plurality of substrates 112 therein. The factory interface 110 is generally maintained at or near atmospheric pressure. In one embodiment, filtered air is supplied to the factory interface 110 to minimize the concentration of particles within the factory interface 110 and correspondingly enhance substrate cleanliness.

The transfer chamber 102 is fabricated from a structural material suitable for use with process and/or cleaning chemistries, for example, an aluminum or steel alloy. In one embodiment, the transfer chamber 102 is fabricated from a single piece of aluminum alloy. The transfer chamber 102 defines an evacuable interior volume 128 through which substrates are transferred between the processing chambers 104 coupled to the exterior of the transfer chamber 102. A pumping system (not shown) is coupled to the transfer chamber 102 through a port 126 disposed on the chamber floor to maintain vacuum within the transfer chamber 102. In one embodiment, the pumping system includes a roughing pump coupled in tandem to a turbomolecular or a cryogenic pump.

The transfer chamber 102 includes a plurality of facets (shown by reference numerals 142A-F, and collectively referred to as facets 142) for mounting the various processing and load lock chambers 104, 106 thereto. A passage 144 is formed through each facet 142 coupling the respective chambers 104, 106 to the interior volume 128 of the transfer chamber 102. Each passage 144 is selectively sealed by a slit valve 146 that is movable between a closed position that isolates the chamber environments and an open position that facilitates substrate transfer between the chambers 104, 106.

Each processing chamber 104 is typically bolted to one of the facets 142 on the exterior of the transfer chamber 102. Examples of processing chambers 104 that may be utilized include etch chambers, physical vapor deposition chambers, heat treatment chambers, chemical vapor deposition chambers, ion implantation chambers, orientation chambers, lithography chambers and the like. Different processing chambers 104 may be coupled to the transfer chamber 102 to provide a processing sequence necessary to form a predefined structure or feature upon the substrate surface.

The load lock chamber 106 is generally coupled between the factory interface 110 and the transfer chamber 102. The load lock chamber 106 is generally used to facilitate transfer of the substrates 112 between the vacuum environment of the transfer chamber 102 and the substantially ambient environment of the factory interface 110 without loss of vacuum within the transfer chamber 102. Each side of the load lock chamber 106 includes a substrate transfer passage that is selectively sealed by one of the slit valves 146 (shown only on the transfer chamber side of the load lock chamber 106) to selectively isolate the interior of the load lock chamber 106 from the transfer chamber 106 and the factory interface 110.

The substrate transfer robot 108 is generally disposed in the interior volume 128 of the transfer chamber 102 to facilitate transfer of the substrates 112 between the various chambers circumscribing the transfer chamber 102. The transfer robot 108 may include one or more blades utilized to support the substrate 112 during transfer. The transfer robot 108 may have two blades, each coupled to an independently controllable motor (known as a dual blade robot) or have two blades coupled to the transfer robot 108 through a common linkage. The axis of rotation of the transfer robot 108 is typically coaxial with a centerline 148 that extends perpendicular to the plane of FIG. 1 from which the robot motion is referenced.

Figure 2:
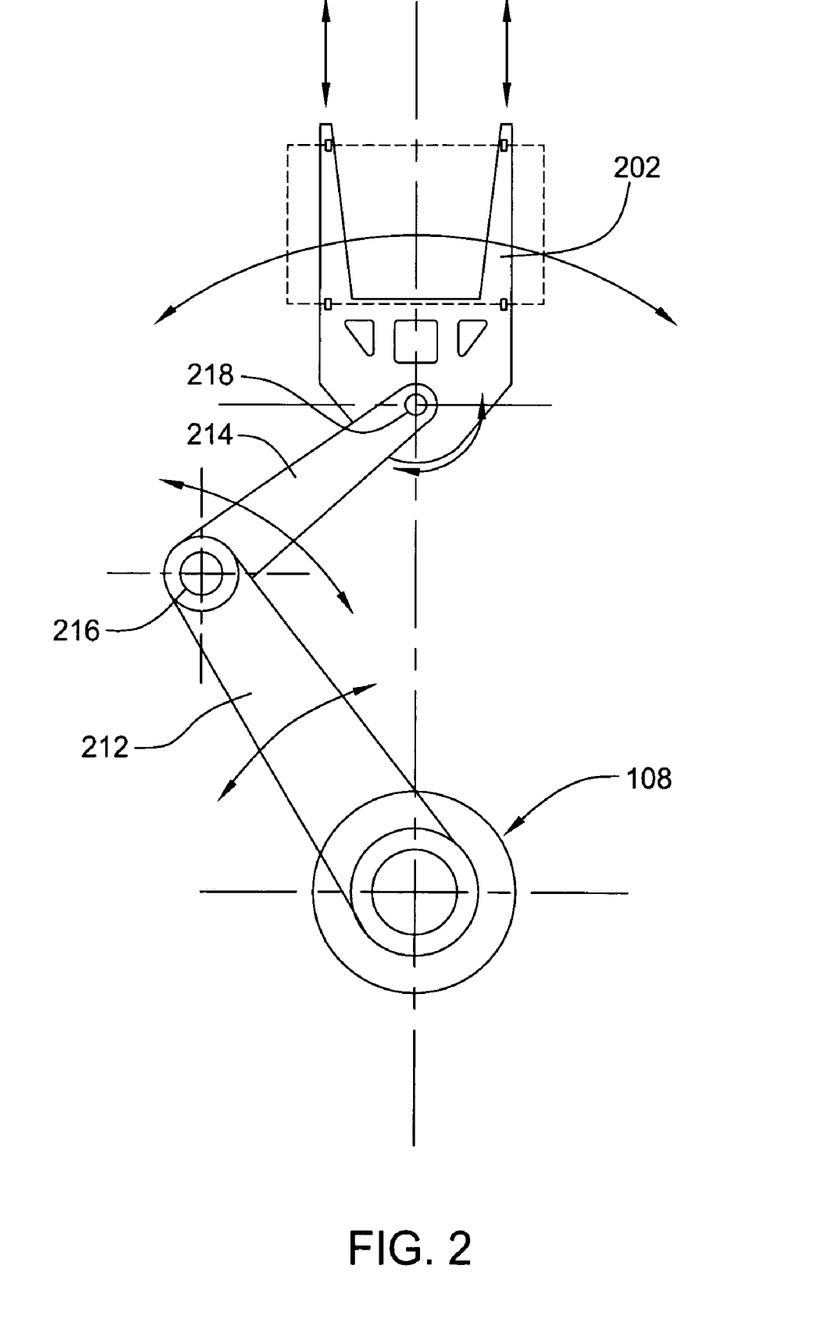
FIG. 2 is a top plan view of one embodiment of the transfer robot of the processing system of FIG. 1.

FIG. 2 is a top plan view of one embodiment of the transfer robot 108 that has a single blade or end effector 202 for supporting a substrate 112 (shown in phantom). The end effector 202 of the robot 108 is coupled to a robot body 204 by a linkage 206. The robot body 204 is generally mounted on the centerline 148 of the transfer chamber 102 such that the end effector 202 (and substrate 112 held thereon) may be positioned radially and rotationally around the centerline 148 of the transfer chamber 102.

The linkage 206 includes a first link 212 rotationally coupled to a second link 214 at an elbow 216. The first link 212 is coupled at a first end to a first motor (not shown) disposed within the robot body 204. The first motor enables the first link 212 to be rotated about the centerline 148 that passes coaxially through the robot body 204. A first end of the second link 214 is rotationally coupled to a second end of the first link 212 at the elbow 216. The rotational orientation between the first and second links 212, 214 about the elbow 216 is controlled by a second motor (also not shown) that may be disposed in the robot body 204. The second motor controls the rotation of the second link 214 about the elbow 216. To extend the end effector 202 radially from the robot body 204, the first motor rotates the first link 212 clockwise while the second link 214 is rotated counterclockwise. To rotate the end effector 202 around the robot body 204, the angle between the first and second links 212, 214 is maintained while the first link 212 is rotated around the robot body 204 by the first motor. The end effector 202 may be moved through other motions in a similar manner.

A second end of the second link 214 is coupled to the end effector 202 at wrist 218. The wrist 218 allows the angular orientation of the end effector 202 and second link 214 to change during robot motion so that the radial orientation of the end effector 202 is maintained relative to the robot body 204. The radial orientation of the end effector 202 may be maintained by a conventional means, such as a third motor, a belt or linkage, none of which are shown.

To monitor the position and orientation of the processing chambers 104 relative to the transfer chamber 102, a number of sensors may be coupled to the transfer chamber 102 and/or processing chambers 104 to provide a metric indicative of chamber position or a metric from which positional information may be resolved. As the positional information is indicative of the substrate exchange position, the robot's motion may be corrected to minimize substrate damage and enhance process results and repeatability. In one embodiment, temperature information may be utilized to resolve positional information. The temperature information may be sensed directly, or modeled using known states of the processing chambers 104 (i.e., chamber off or inactive, chamber cooling rates and the like). In other embodiments, empirical data may be used to predict chamber position or the chamber position may be directly sensed.

Figure 3:
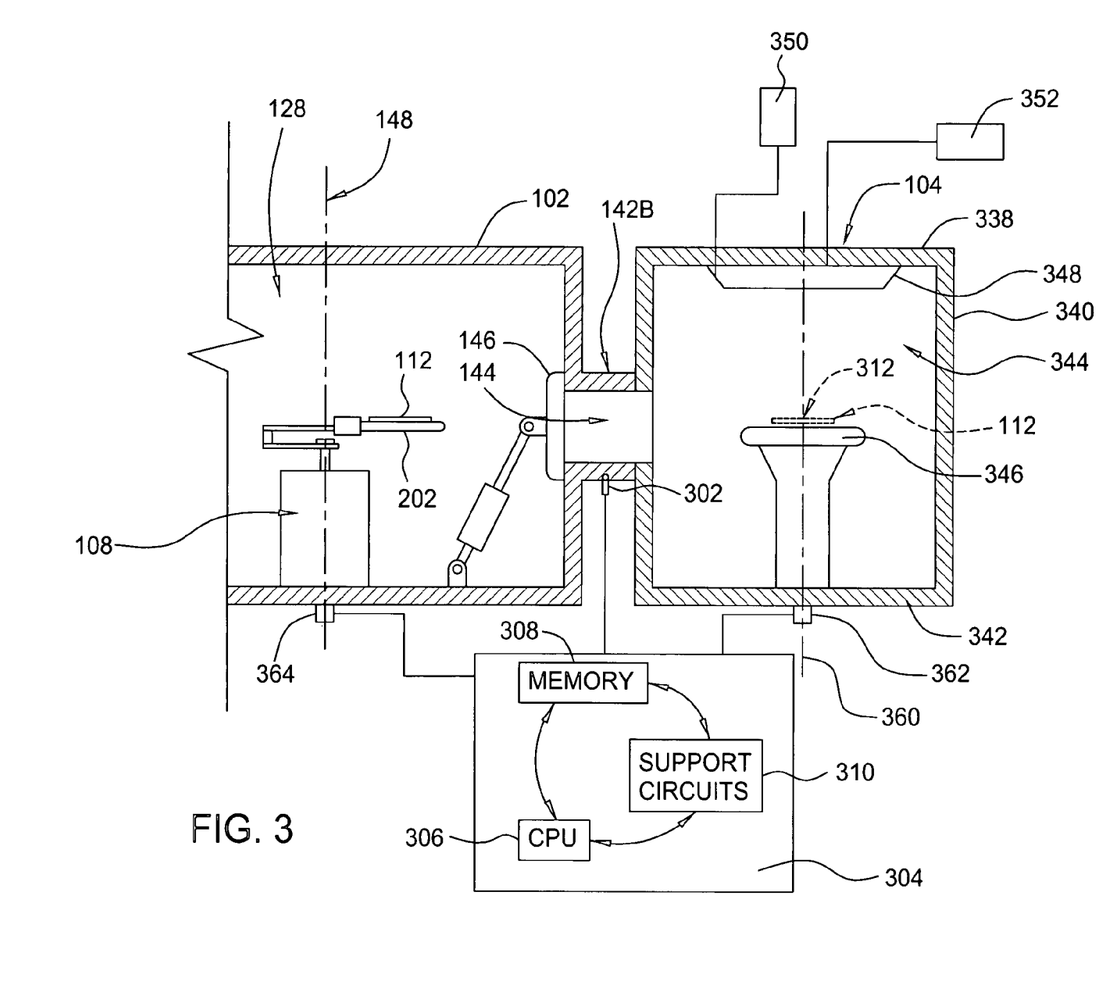
FIG. 3 is a partial sectional view of the processing system of FIG. 1.

FIG. 3 is a partial sectional view of the processing system 100 through the facet 142B depicting a temperature sensor 302 coupled to the transfer chamber 104 proximate the facet 142B. The other facets 142, not shown in FIG. 3, may be similarly equipped with temperature sensors.

In one embodiment, the temperature sensor 302 is a thermocouple threaded into or fastened to transfer chamber 104 proximate the facet 142B. It is contemplated that other types of temperature sensors may be utilized, such as infrared sensors, among others. The temperature sensor 302 is coupled to a controller 304 that controls the motion of the transfer robot 108. The temperature sensor 302 provides the controller 304 with a signal indicative of the temperature of the facet 142B.

The processing chamber 104 coupled to the facet 142B generally includes a bottom 342, sidewalls 340 and a lid 338 that enclose a process volume 344. In one embodiment, the processing chamber 104 may be a plasma enhanced chemical vapor deposition (PECVD) chamber. A pedestal or substrate support 346 is disposed in the process volume 344 and generally supports the substrate during processing. A gas distribution plate 348 is coupled to the lid 338 and may be biased by a power source 350. A gas supply 352 is coupled to the processing chamber 104 and supplies process and other gases to the process volume 344 through the distribution plate 348. The supply 352 provides a process gas that decomposes in a plasma and deposits on the substrate.

The processing chamber 104 has a predefined substrate exchange position 312 (shown in phantom by the substrate 112), typically located coaxial with a centerline 360 of the processing chamber 104 that passes through the center of the substrate support 346. The exchange position 312 is defined by a fixed structure of the processing chamber 104, for example, the center line 360 of the substrate support 346. During system calibration, the robot is taught to move to a taught position that aligns with the exchange position 312 and center line 360. During substrate transfer, the substrate 112 supported by the end effector 202 is moved to the taught position such that the center line 360 passes through the midpoint of the substrate 112 when in the substrate exchange position 312.

The controller 304 generally includes a CPU 306, memory 308 and support circuits 310. The CPU 306 may be one of any form of computer processor that can be used in industrial settings for controlling various chambers and subprocessors. The memory 308 is coupled to the CPU 306. The memory 308, or computer-readable medium, may be one or more of readily-available memory such as random access memory (RAM) read-only memory (ROM), floppy disk, hard drive, device buffer or any other form of digital storage, local or remote. The support circuits 310 are coupled to the CPU 306 for supporting the processor in a conventional manner. These circuits 310 may include cache, power supplies, clock circuits, input-output circuitry, subsystems and the like.

In one embodiment, the controller 304 uses information provided by the temperature sensor 302 to correct the movement to the transfer robot 108 to ensure accurate and repeatable positioning of the substrate 112 at the substrate exchange position 312 if the taught and exchange positions become misaligned as the system experiences changes in its temperature profile. For example, using the temperature of facet 142B provided to the controller 304 by the temperature sensor 302, the controller 304 can resolve the relative change in position between the robot's axis of rotation that is disposed concentrical to the centerline 148 of the transfer chamber 102 and the exchange position 312 within the processing chamber 104. The controller 304 also monitors the temperature of the other facets 142 through the sensors 302 coupled or interfacing therewith to determine if the temperature of the other facets 142 affects the exchange position 312.

The controller 304 resolves the relative change in chamber positions and hence, the current position of the substrate exchange position 312 through an algorithm stored in the memory 308 that utilizes temperature sensed from at least one facet 142 by the temperature sensor 302 as a variable. For example as depicted in the simplified top view processing chamber schematics of FIGS. 4A-B, if the sensor 302 coupled to the transfer chamber 104 at facet 142B senses a temperature change, the controller 304 determines if that change in temperature results in a change in angular orientation or distance of any of the facets 142A-F relative to the transfer chamber's centerline 148. If the controller 304 determines that a sensed change in temperature results in a change in position or orientation of the facet 142B through which the substrate will pass during transfer, the controller 304 adjusts the angular position of each link 212, 214 so that the end effector 202 is positioned at a corrected exchange position 402 to ensure accurate positioning of the substrate and damage free transfer while enhancing processing performance, repeatability and device yield. In other words, the positioning of the robot is adjusted from the taught position to a corrected position, then aligns with the shifted exchange position.

Figure 4A:
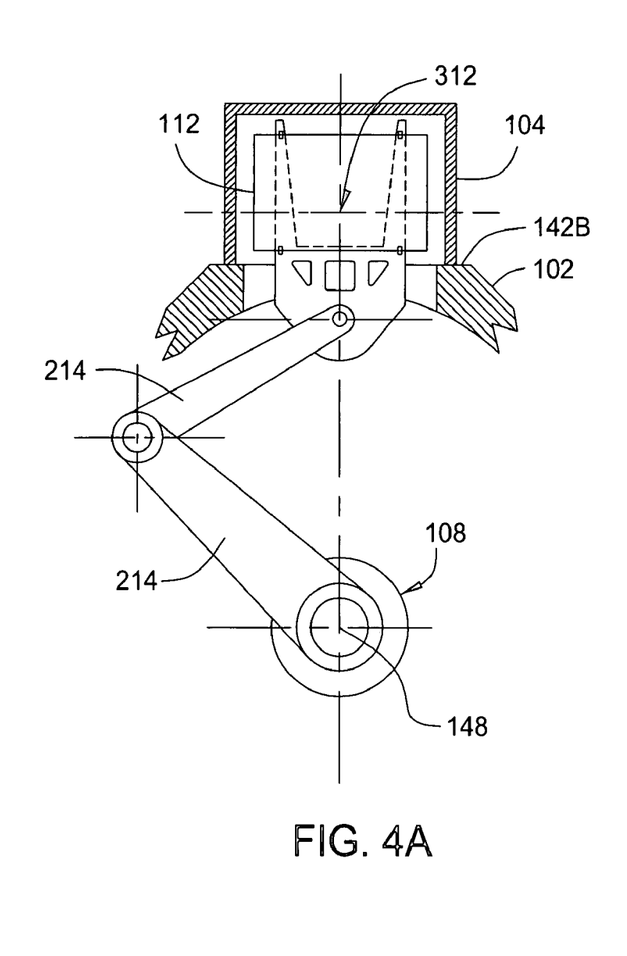
FIGS. 4A-B are partial sectional views illustrating an end effector of a robot in a predefined substrate transfer position and a corrected substrate transfer position.
Figure 4B:
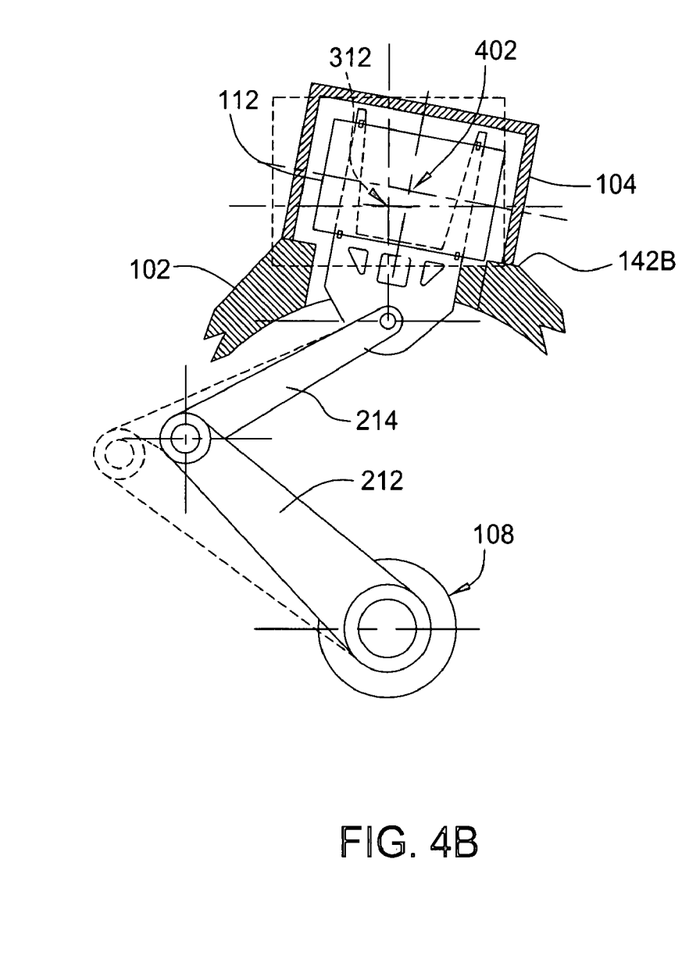

In another embodiment, the controller 304 may resolve the relative change in chamber positions utilizing empirical data stored in memory 308 that includes information regarding positional shift of the processing chamber centerline 360 due to temperature influences. The controller 304 is provided with information indicative of a temperature change of the transfer chamber 102, for example, a change in state of one of the surrounding processing chambers 104 (such as being turned on or off, cleaned, pumped down and the like). The empirical data may include information such as temperature loss per unit time of the facet 142 associated with the change in processing chamber state and the amount of movement of the processing chambers corresponding to the temperature condition, among others. The position of the processing chamber's centerlines 360 are modeled by the controller 304 for each processing chamber state along with the time lapsed from each state change. Utilizing this information, the controller 304 will adjust the transfer robot's movement to ensure the end effector 202 is positioned in the corrected exchange position 402 similar to as described above.

Figure 5:
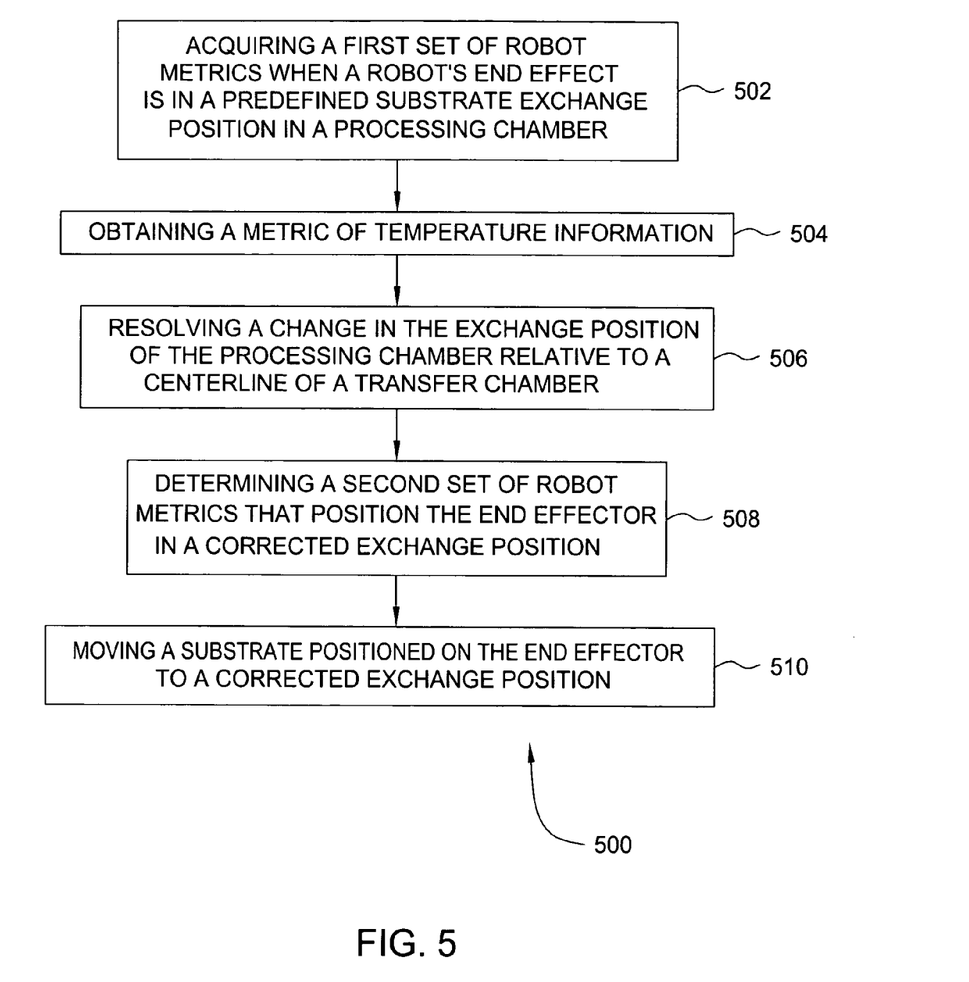
FIG. 5 depicts a flow diagram of one embodiment of a method for determining a substrate exchange position within a processing chamber.

FIG. 5 depicts a flow diagram of one embodiment of a method 500 for determining a corrected substrate exchange position 402 within a processing chamber 104 coupled to a transfer chamber 102. The method 500, among other embodiments of the invention, is generally stored in the memory 308, typically as a software routine. The software routine may also be stored and/or executed by a second CPU (not shown) that is remotely located from the hardware being controlled by the controller 304.

The method 500 begins at step 502 by acquiring a first set of robot metrics when the end effector is in a taught position aligned with a predefined exchange position within the process chamber 104. The taught position in the process chamber may be generated by a robot calibration step that includes recording robot rotation and extension information that positions an end effector 202 of the robot 108 properly into the processing chamber 104 to facilitate accurate and repeatable substrate transfer. In one embodiment, the end effector 202 is aligned with the exchange position when the end effector centers the substrate within the processing chamber 104 relative to the process chamber's centerline 360. In one embodiment, the first set of robot metrics may include angular information of the first and second links 212, 214.

At step 504, a metric of temperature information is obtained by the controller 304. The metric of temperature information may come from information regarding the state of the processing chambers 104 or from at least one of the sensors 302 adapted to sense temperature information at the facets 142. At step 506, the controller 304 resolves a change in the exchange position (e.g., determines a shifted exchange position 402) of the processing chamber 104 relative to the centerline 148 of the transfer chamber 102.

At step 508, the controller 304 determines a second set of robot metrics needed to position the end effector 202 in the shifted exchange position 402. Generally, the second set of robot metrics, such as the angular position of the first and second links 212, 214, may be stored for continued use if the sensors 302 indicate a steady-state temperature condition. At set 510, a substrate 112 positioned on the end effector 202 of the robot 108 is moved to the shifted exchange position 402.

Figure 6:
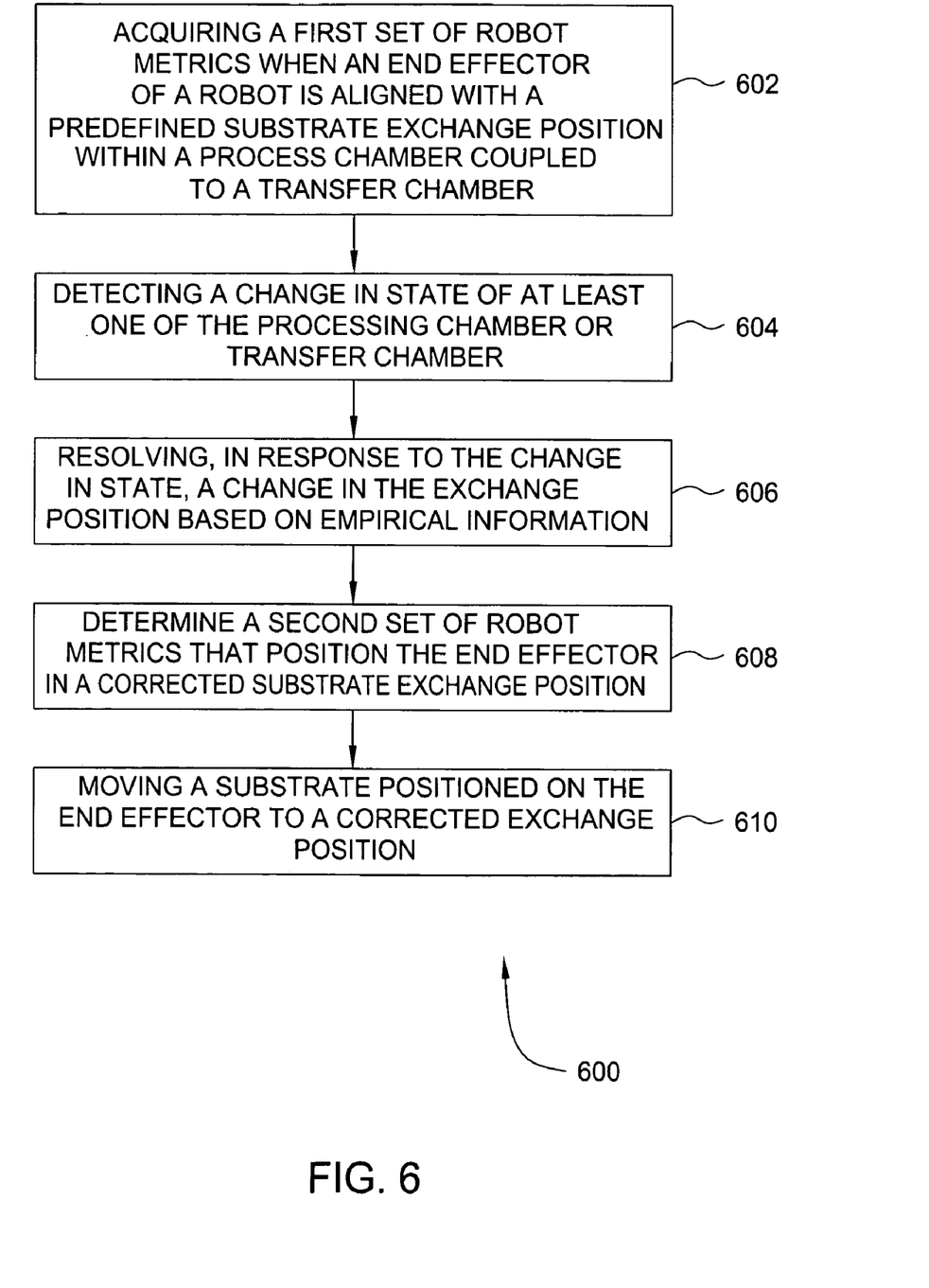
FIG. 6 depicts a flow diagram of another embodiment of a method for determining a substrate exchange position within a processing chamber.

FIG. 6 depicts a flow diagram of another embodiment of a method 600 for determining a corrected substrate exchange position 402 within a processing chamber 104 coupled to a transfer chamber 102. The method 600 begins at step 602 by acquiring a first set of robot metrics when an end effector 202 of a robot 108 is aligned with a predefined substrate exchange position 312 within a process chamber.

At step 604, a change in state of at least one of the processing chambers 104 or transfer chamber 102 is detected by the controller 304. The detection may include a sensed indicator, a predefined event, or an instruction by the controller 304 to change the state of the processing chambers 104. At step 606, the controller 304, in response to the change in state, resolves a change in the exchange position 312 within one of the processing chambers 104 relative to the centerline of the transfer chamber 102 based on empirical information stored in the controller's memory 308. Step 606 may additionally include resolving the change in the exchange position based on elapsed time from one or more of change in states.

At step 608, the controller 304 determines a second set of robot metrics needed to position the end effector in alignment with the shifted substrate exchange position 402. Generally, the second set of robot metrics, such as the angular position of the first and second links 212, 214, may be stored for continued use if the sensors 302 indicate a steady-state temperature condition. At set 610, a substrate 112 positioned on the end effector 202 of the robot 108 is moved to the corrected exchange position.

Returning to FIG. 3, the processing system 100 may also be equipped with sensors 362 adapted to detect the centerline 360 of the processing chambers 104, one of which is shown in FIG. 3. Each of the sensors 362 may be coupled directly to the system 100 or be positioned to provide information regarding the centerline 360 of a respective processing chamber 104.

In one embodiment, the sensor 362 is an image capturing device that is coupled to the bottom 342 of the processing chamber 104. For example, the sensor 362 may be positioned coaxial with the centerline 360 of the substrate support 346 disposed in the processing chamber 104. The centerline 360 may also be the centerline of the processing chamber 104. As the centerline 360 of the substrate support 346 shifts when subjected to a change in thermal conditions within the transfer chamber 102, or one of the processing chambers 104, the sensor 362 provides the controller 304 with data from which the movement (e.g., current position) of the centerline 360 of the substrate support 346 and exchange position aligned therewith may be resolved through conventional machine vision techniques. From the information provided by the sensor 362, the controller 304 may adjust the transfer robot's motion as described above to ensure the substrate 112 is positioned at a corrected (e.g., current) exchange position. It is contemplated that other sensors 362 capable of providing information from which the position of the processing chamber 104 or the centerline 360 of the substrate support 346 may be alternatively utilized.

Optionally, a sensor 364 may also be adapted to provide information from which the position of the centerline 148 of the transfer chamber 104 may be resolved. The information provided by the sensor 364 can be utilized to track the robot's centerline and axis of rotation, which are coaxial with the chamber centerline 148. As the robot's centerline is the reference point for robot movement, accounting for changes in the robot's centerline position increases the accuracy of relative positions of the robot and processing chamber centerlines, so that a more precise exchange position may be resolved.

Figure 7:
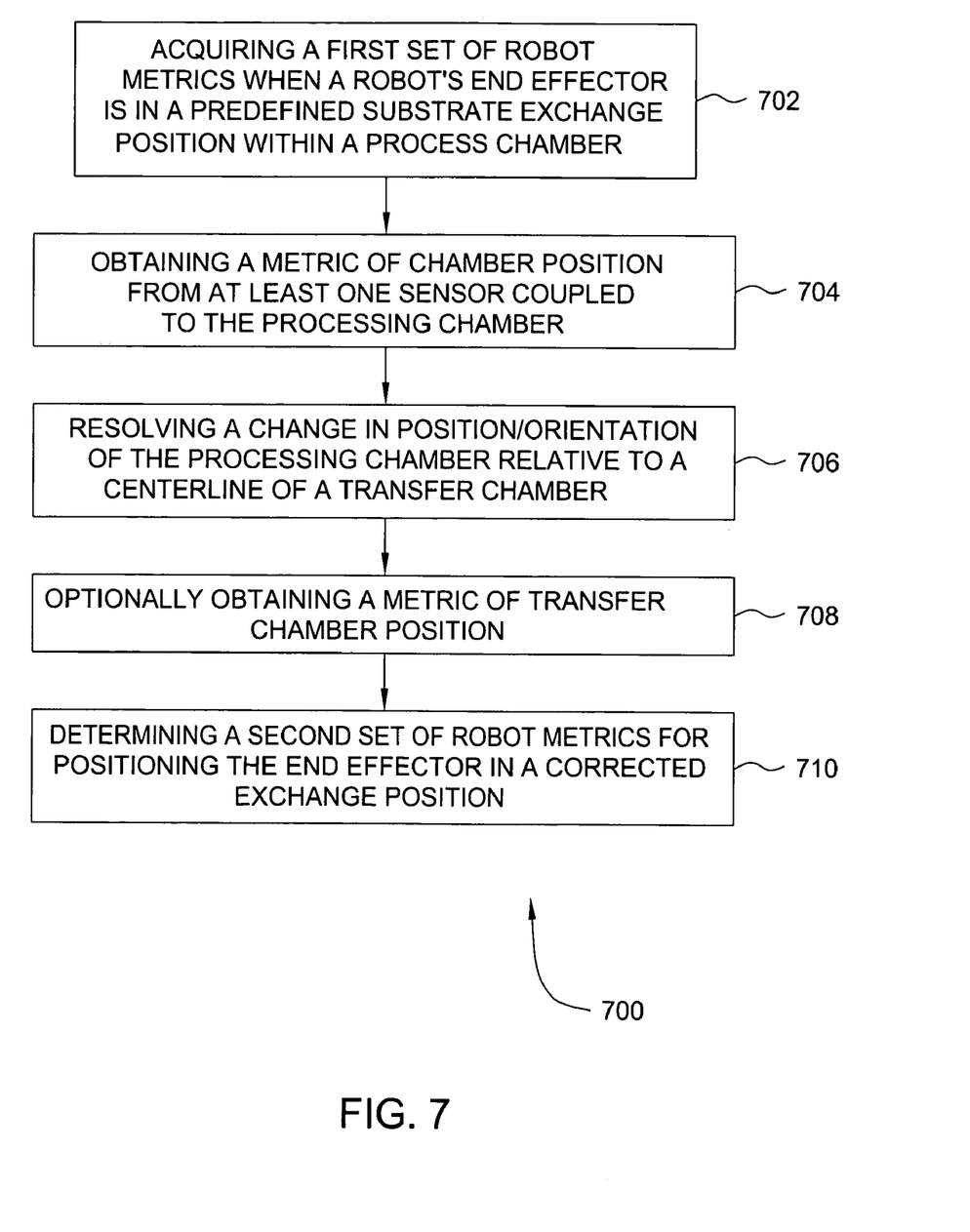
FIG. 7 depicts a flow diagram of another embodiment of a method for determining a substrate exchange position in a processing chamber.

FIG. 7 depicts a flow diagram of another embodiment of a method 700 for determining a substrate exchange position in a processing chamber 104. The method 700 begins at step 702 by acquiring a first set of robot metrics when a robot's end effector 202 is aligned with a predefined substrate exchange position 312 within the process chamber 104.

At step 704, a metric of chamber position is obtained by the controller 304 from at least one of the sensors 362. At step 706, the controller 304 resolves a change in position/orientation of the processing chamber 104 relative to the centerline 148 of the transfer chamber 102. As the substrate exchange position moves with the processing chamber 104, by resolving the change in position/orientation of the processing chamber 104, the exchange position is resolved concomitantly.

At optional step 708, a metric of transfer chamber position is obtained by the controller 304 from the sensors 364. The metric of transfer chamber position may be utilized by the controller 304 to more accurately resolve the distance and angular orientation between the current centerline 148 of the transfer chamber 102 and the current position of the centerline 360 of the processing chamber 104 that is aligned with the exchange position. At step 710, the controller 304 determines a second set of robot metrics for positioning the end effector 202 in the current (e.g., corrected) exchange position 402.

Figure 8:
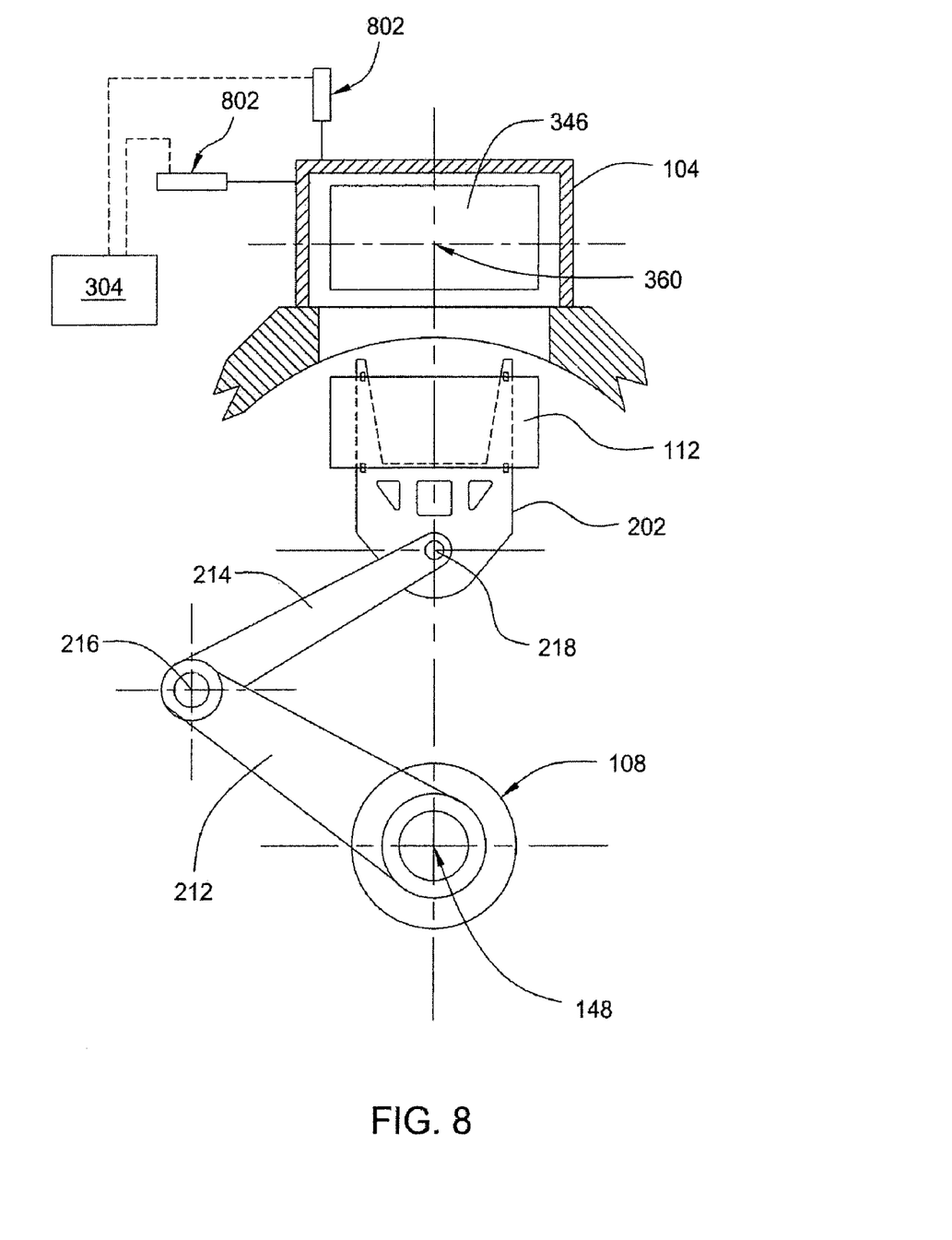
FIG. 8 is a top view of the processing chamber depicted in FIG. 3.

FIG. 8 is a top view of the processing chamber 104 depicted in FIG. 3. One or more sensors 802 are interfaced with at least one of the processing chambers 104 or transfer chamber 102 to provide the controller 304 with information indicative of the position of the processing chamber 104. In one embodiment, the sensors 802 comprise two linear displacement transducers adapted to detect movement of the processing chamber 104 along two axes. The controller 302 may utilize the positional information provided by the sensors 802 to determine the movement of the centerline 360 of the processing chamber 104 so that the motion of the transfer robot 108 may be corrected to ensure repeatable and accurate placement of the substrate 112 within the processing chamber 104.

Thus, various embodiments of a method and apparatus for determining a substrate exchange position have been provided. The substrate exchange position may be updated in response to a change in chamber position due to thermal effects. Accordingly, the thermal effects on the position of the exchange position may be determined in real time for each substrate transfer, thereby allowing the controller 302 to adjust the position of the substrate 112 for each transfer, ensuring accurate, damage free, substrate placement, as well as improved processing and device yield.

While the foregoing is directed to the preferred embodiment of the present invention, other and further embodiments of the invention may be devised without departing from the basic scope thereof, and the scope thereof is determined by the claims that follow.

What is claimed is:

1. A method for transferring a substrate in a processing system having at least one processing chamber coupled to a transfer chamber housing a robot, the method comprising:
   teaching the robot to move to an exchange position defined in the processing system; and
   monitoring a condition within the processing system by sensing a change in temperature within a facet of the transfer chamber through which the robot must extend to reach the exchange position;
   determining a shift in the exchange position based on the monitored condition; and
   correcting motion of the robot to compensate for the shift in the exchange position.

2. The method of claim 1, wherein the sensing the change in temperature further comprises:
   sensing a change in temperature of a different facet of the transfer chamber.

3. A method for transferring a substrate in a processing system having at least one processing chamber coupled to a transfer chamber housing a robot, the method comprising:
   teaching the robot to move to an exchange position defined in the processing system;
   monitoring a condition within the processing system;
   determining a shift in the exchange position based on the monitored condition by sensing a change in position of the at least one processing chamber; and
   correcting motion of the robot to compensate for the shift in the exchange position.

4. The method of claim 3, wherein the sensing the change in position of the at least one processing chamber further comprises:
   sensing a metric indicative of a position of a centerline of the at least one processing chamber.

5. The method of claim 3, wherein the sensing the change in position of the at least one processing chamber further comprises:
   sensing a metric indicative of a position of a centerline of the transfer chamber.

6. A method for transferring a substrate in a processing system having at least one processing chamber coupled to a transfer chamber housing a robot, the method comprising:
   teaching the robot to move to an exchange position defined in the processing system; and
   correcting motion of the robot to compensate for a shift in the exchange position by:
      measuring a change in at least one of the position and orientation of the at least one processing chamber relative to the transfer chamber; and
      adjusting motion of the robot to compensate for the measured changes.

7. A method for transferring a substrate in a processing system having at least one processing chamber coupled to a transfer chamber housing a robot, the method comprising:
   teaching the robot to move to an exchange position defined in the processing system; and
   correcting motion of the robot to compensate for a shift in the exchange position by:
      sensing a change in at least one of the position and orientation of the at least one processing chamber relative to the transfer chamber; and
      adjusting motion of the robot to compensate for the sensed changes.

8. A method for transferring a substrate in a processing system having at least one processing chamber coupled to a transfer chamber housing a robot, the method comprising:
   teaching the robot to move to an exchange position defined in the processing system; and
   correcting motion of the robot to compensate for a shift in the exchange position by:
      resolving a change in at least one of the position and orientation of the at least one processing chamber relative to the transfer chamber; and
      adjusting motion of the robot to compensate for the resolved changes.

9. The method of claim 8, wherein the resolving changes further comprises at least one of modeling thermal expansion of the transfer chamber, modeling thermal expansion of the at least one processing chamber, and utilizing empirical data that is representative of relative positions of the at least one processing chamber relative to the transfer chamber due to thermal effects.

10. A method for transferring a substrate in a processing system having at least one processing chamber coupled to a transfer chamber housing a robot, the method comprising:

teaching the robot to move to an exchange position defined in the processing system; and correcting motion of the robot to compensate for a shift in the exchange position due to a change in the thermal profile of the transfer chamber.

11. A method for transferring a substrate in a processing system having at least one processing chamber coupled to a transfer chamber housing a robot, the method comprising:

teaching the robot to move to an exchange position defined in the processing system; and correcting motion of the robot to compensate for a shift in the exchange position due to a change in the thermal profile of the at least one processing chamber.

12. A method for transferring a substrate in a processing system having at least a first processing chamber coupled to a transfer chamber housing a robot, the method comprising:

defining an exchange position of the first processing chamber;

sensing temperature of at least one component of the system that results in a shift in the exchange position;

resolving the shift in the exchange position corresponding to the sensed temperature; and correcting robot motion to compensate for the shift in the exchange position.

13. The method of claim 12, wherein the sensing further comprises:

sensing a temperature of at least one facet of the transfer chamber.

14. The method of claim 12, wherein the resolving further comprises:

determining a change in at least one of the position and orientation of a facet of the transfer chamber from which the temperature was sensed.

15. A method for transferring a substrate in a processing system having at least a first processing chamber coupled to a transfer chamber housing a robot, the method comprising:

teaching the robot to move to an exchange position defined in the first processing chamber relative to a predefined reference point within the transfer chamber;

detecting a shift in the exchange position by determining a change in at least one of the position and orientation of a facet of the transfer chamber corresponding to a change in a sensed temperature; and correcting the taught robot motion to compensate for the shift in the exchange position.

16. A method for transferring a substrate in a processing system having at least a first processing chamber coupled to a transfer chamber housing a robot, the method comprising:

teaching the robot to move to an exchange position defined in the first processing chamber relative to a predefined reference point within the transfer chamber;

detecting a shift in the exchange position by determining a change in at least one of position and orientation of the first processing chamber; and correcting the taught robot motion to compensate for the shift in the exchange position.

17. A method for transferring a substrate in a processing system having at least a first processing chamber coupled to a transfer chamber housing a robot, the method comprising:

establishing a predefined reference point within the transfer chamber and an exchange position of the first processing chamber;

teaching the robot to move to the exchange position;

monitoring relative positional change between the reference point and exchange position, wherein the monitoring the relative positional change between the reference point and exchange position further comprises detecting a change in lateral position of a substrate support disposed in the first processing chamber; and correcting the taught position of the robot in response to the relative positional change, thereby allowing the robot to arrive at the exchange position.

18. A method for transferring a substrate in a processing system having at least a first processing chamber coupled to a transfer chamber housing a robot, the method comprising:

establishing a predefined reference point within the transfer chamber and an exchange position of the first processing chamber;

teaching the robot to move to the exchange position;

monitoring relative positional change between the reference point and the exchange position, wherein the monitoring the relative positional change between the reference point and the exchange position further comprises detecting a change in lateral position of the reference point of the transfer chamber due to thermal changes of the transfer chamber; and correcting the taught position of the robot in response to the relative positional change, thereby allowing the robot to arrive at the exchange position.

* * * * *